United States Patent
Xie

(10) Patent No.: US 9,985,015 B2
(45) Date of Patent: May 29, 2018

(54) SEMICONDUCTOR DEVICE HAVING IMPROVED CORE AND INPUT/OUTPUT DEVICE RELIABILITY

(71) Applicant: SEMICONDUCTOR MANUFACTURING INTERNATIONAL (SHANGHAI) CORPORATION, Shanghai (CN)

(72) Inventor: Xinyun Xie, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days. days.

(21) Appl. No.: 15/299,282

(22) Filed: Oct. 20, 2016

(65) Prior Publication Data

US 2017/0040310 A1 Feb. 9, 2017

Related U.S. Application Data

(62) Division of application No. 14/169,146, filed on Jan. 30, 2014, now Pat. No. 9,502,403.

(30) Foreign Application Priority Data

Aug. 1, 2013 (CN) .......................... 2013 1 0326647

(51) Int. Cl.
| | |
|---|---|
| *H01L 27/02* | (2006.01) |
| *H01L 29/51* | (2006.01) |
| *H01L 21/28* | (2006.01) |
| *H01L 27/088* | (2006.01) |
| *H01L 29/66* | (2006.01) |
| *H01L 29/78* | (2006.01) |
| *H01L 21/8234* | (2006.01) |
| *H01L 29/423* | (2006.01) |

(52) U.S. Cl.
CPC ...... *H01L 27/0207* (2013.01); *H01L 21/2822* (2013.01); *H01L 21/28176* (2013.01); *H01L 21/823437* (2013.01); *H01L 21/823462* (2013.01); *H01L 27/088* (2013.01); *H01L 29/42364* (2013.01); *H01L 29/51* (2013.01); *H01L 29/511* (2013.01); *H01L 29/66545* (2013.01); *H01L 29/66606* (2013.01); *H01L 29/78* (2013.01)

(58) Field of Classification Search
CPC ..... H01L 21/823857; H01L 21/823462; H01L 21/28176
See application file for complete search history.

(56) References Cited

U.S. PATENT DOCUMENTS

| | | | | |
|---|---|---|---|---|
| 6,818,518 | B1* | 11/2004 | Chidambaram | H01L 21/823418 257/E21.619 |
| 2008/0164539 | A1* | 7/2008 | Collaert | H01L 21/28079 257/411 |

(Continued)

*Primary Examiner* — Mounir Amer
(74) *Attorney, Agent, or Firm* — Kilpatrick Townsend & Stockton LLP

(57) ABSTRACT

A semiconductor device includes a semiconductor substrate having a core device and an IO device. The core device includes a gate interface layer and a high-k dielectric layer on the gate interface layer. The IO device includes a gate interface layer and a high-k dielectric layer on the gate interface layer. The gate interface layer of the core device and the gate interface layer of the IO device each are doped with fluoride ions.

3 Claims, 10 Drawing Sheets

(56) References Cited

U.S. PATENT DOCUMENTS

| | | | |
|---|---|---|---|
| 2012/0146159 A1* | 6/2012 | Wang | G03F 7/70633 257/410 |
| 2013/0075827 A1* | 3/2013 | Lee | H01L 29/4966 257/369 |
| 2013/0330900 A1* | 12/2013 | Pandey | H01L 21/265 438/301 |

* cited by examiner

SEMICONDUCTOR DEVICE HAVING IMPROVED CORE AND INPUT/OUTPUT DEVICE RELIABILITY

CROSS-REFERENCES TO RELATED APPLICATIONS

This application is a divisional application of U.S. patent application Ser. No. 14/169,146, filed on Jan. 30, 2014, which claims priority to Chinese Application No. 201310326647.9, filed on Aug. 1, 2013 with the State Intellectual Property Office of People's Republic of China, the content of which is incorporated herein by reference in their entirety.

BACKGROUND OF THE INVENTION

The present invention relates generally to semiconductor technology. More particularly, embodiments of the present invention provide a semiconductor device having improved core and inputs/outputs reliability and a method for manufacturing the semiconductor device.

Increasing circuit density has not only improved the complexity and performance of integrated circuit devices but also has provided lower cost parts to consumers. With decreasing feature sizes and increasing current density in semiconductor devices, in order to reduce the equivalent oxide thickness of the layer (EOT), high-k dielectric layer after the metal gate (high-K/metal gate all last) is generally required for the completion of the manufacturing process of a semiconductor device. The challenge is to ensure the reliability of a gate dielectric layer (IL) of a high-k/metal gate last process. As is well known, fluoride can improve the effect of negative bias temperature instability (negative bias temperature instability, NBTI) of PMOS devices and hot-carrier injection (HCI) effects of NMOS devices. However, since the high-k dielectric layer process requires the removal of dummy gate dielectric layer (also known as a dummy gate oxide layer) prior to forming the gate dielectric layer and the high-k dielectric layer, the challenge is thus finding a way to implant fluoride ions into the high-k dielectric layer of the device.

In the case of silicon oxynitride (SiON) as a gate oxide layer or high-k dielectric layer/metal gate first process, implantation of fluoride ions can be performed into a dummy dielectric layer and source/drain after the dummy dielectric layer (typically polysilicon) has been formed and before peak annealing of the source/drain of the device. The fluoride ions can be fluorine or fluorine-containing compounds such as boron trifluoride). After annealing of the source and drain, a strong chemical bond between Hf—F and Si—F interface can be formed. However, a large dose of implanted fluoride ions may damage the semiconductor substrate. Thus, high-k dielectric layer last technology requires a thermal budget that does not use high temperature annealing.

Thus, finding a way to manufacture a semiconductor device having a high-k dielectric layer using a low thermal budget to reduce the effects of large doping of fluoride ions is highly sought after.

BRIEF SUMMARY OF THE INVENTION

Certain embodiments of the present invention relate to a semiconductor device and methods for manufacturing the semiconductor device. According to certain embodiments, a semiconductor device may include a semiconductor substrate having a core device and an IO (input/output) device. The core device may include a gate interface layer and a high-k dielectric layer on the gate interface layer. The IO device may include a gate interface layer and a high-k dielectric layer on the gate interface layer. In an embodiment, the gate interface layer of the core device and the gate interface layer of the IO device each are doped with fluoride ions. In another embodiment, the high-k dielectric layer of the core device and the high-k dielectric layer of the IO device each are doped with fluoride ions. In yet another embodiment, the high-k dielectric layer of the core device and the high-k dielectric layer of the IO device each have a U-shaped cross-section. Additional, the semiconductor device may include a work function on the high-k dielectric layer of the core device and a metal gate on the work function, and a work function on the high-k dielectric layer of the IO device and a metal gate on the work function.

Certain embodiments of the present invention relate to a method for manufacturing a semiconductor device. The method includes providing a semiconductor substrate, forming on the semiconductor substrate a dummy gate interface layer and a dummy gate of a core device and a gate interface layer and a dummy gate of an IO device, removing the dummy gates of the core and IO devices, and removing the dummy gate interface layer of the core device. The method also includes forming a gate interface layer in the original location of the removed dummy gate interface layer, forming a high-k dielectric layer each on the gate interface layer of the core and IO devices, and submitting the semiconductor substrate to a high-pressure fluorine annealing. The high-pressure fluorine annealing causes the gate interface layer and the high-k dielectric layer of the core and IO devices to be doped with fluoride ions.

The following descriptions, together with the accompanying drawings, will provide a better understanding of the nature and advantages of the claimed invention.

DETAILED DESCRIPTION OF THE INVENTION

Figure 1A:
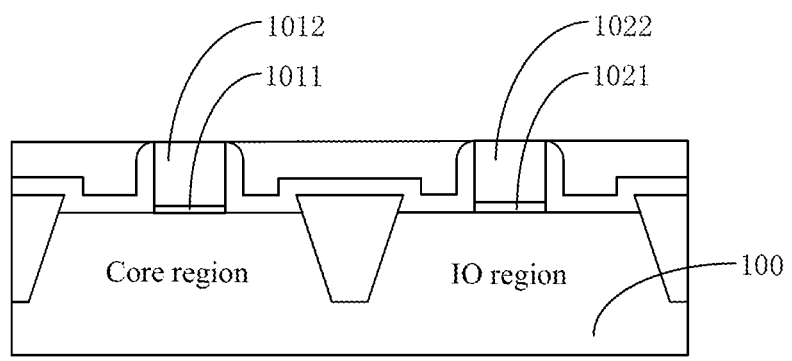
FIGS. 1A to 1F are sectional views showing sequential steps of a method of manufacturing a semiconductor device according to certain embodiments of the present invention.

Embodiments of the present invention will be described more fully hereinafter with reference to the accompanying drawings, in which cross-sectional views of sequences of process steps of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

For the sake of brevity, well-known techniques and/or materials are not described herein.

The drawings may not be drawn to scale for clarity, and the sizes and relative sizes of layers and regions may be exaggerated. The same reference numerals may denote the same elements.

It should be understood that when an element or layer is referred to as on, "adjacent", "connected to", or "coupled to" another element or layer, it can be disposed or formed directly on the other element or layer, adjacent, connected or coupled to the other element or layer or intervening elements may be present. In contrast, when an element is referred to as being "directly on", "directly adjacent," "directly connected to", or "directly coupled to" another element or layer, there are no intervening elements or layers present. The use of the terms "first", "second", etc. do not denote any order, but rather the terms "first", "second", etc. are used to distinguish one element from another. Furthermore, the use of the terms "a", "an", etc. does not denote a limitation of quantity, but rather denote the presence of at least one of the referenced items.

In the following description, reference is made to the accompanying drawings which form a part hereof, and in which is shown by way of illustration specific embodiments in which the invention may be implemented. The term "upper", "lower", "top", "down", "below" "beneath", or "above", is used with reference to the orientation of the Figures being described. Because components of embodiments of the present invention can be positioned in a number of different orientations, the term is used for purposes of illustration and is not limiting.

The purpose of terms used in this specific embodiment is illustrative only and should not be construed as limiting the present invention. When used herein, the singular forms "a", "an" and "said/the" are intended to include the plural forms unless the context explicitly points to another way. It should also be understood that the terms "consisting of" and/or "comprising," when used in this specification, determine the features, integers, steps, operations, elements, and/or components, but do not exclude one or more other features, integers, steps, operations, or additional elements, components, and/or groups. When used herein, the term "and/or" includes any and all combinations of the associated listed items.

Embodiments of the invention are described herein with cross-sectional views of idealized embodiments (and intermediate structures' of the present invention. Variations from the shapes of the illustrations as a result, for example, of manufacturing techniques and/or tolerances, are to be expected. Thus, embodiments of the present invention should not be construed as limited to the particular shapes of regions, but are to include deviations in shapes that result, for example, from manufacturing process variations. For example, an implanted region shown as a rectangle will, typically, have rounded or curved features and/or a gradient of implant concentration at its edges rather than a discrete change from an implanted to a non implanted region. Likewise, a buried region formed by implantation may result in some implantation in the region between the buried region and the surface through which the implantation takes place. Therefore, the regions shown in the figures are schematic in nature and their shapes are not intended to illustrate the actual shape of a region of a device and are not intended to limit the scope of the invention.

For a thorough understanding of the present invention, and the detailed steps will be presented in detail in the following description of the structure in order to explain the semiconductor device and a manufacturing method of the present invention is proposed. The preferred embodiment of the present invention is described in detail below, but in addition to the detailed description, the present invention also may have other embodiments.

First Embodiment

The method of manufacturing a semiconductor device according to a first embodiment of the present invention includes submitting a semiconductor substrate to a high-pressure fluorine annealing process, after forming a gate interface layer or a high-k dielectric layer of the core device and IO device, to implant fluoride ions to the gate interface layer or a high-k dielectric layer of the core device and IO device. In this process, fluorine is implanted into the gate interface layer, and the interface between the gate interface layer and the semiconductor substrate, or the high-k dielectric layer to improve the quality of the gate dielectric layer (including the gate interface layer, high-k dielectric quality layer). Thereafter, a strong chemical bond of the Hf—F and Si—F is formed on the interface between the gate interface layer and the semiconductor substrate, which will be beneficial to the stability of the core device and the IO device.

Figure 1B:
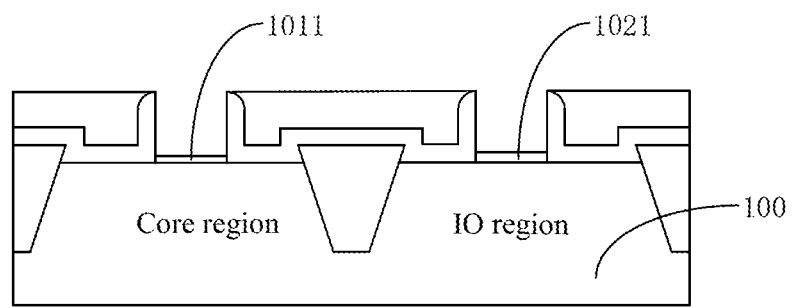
Figure 1C:
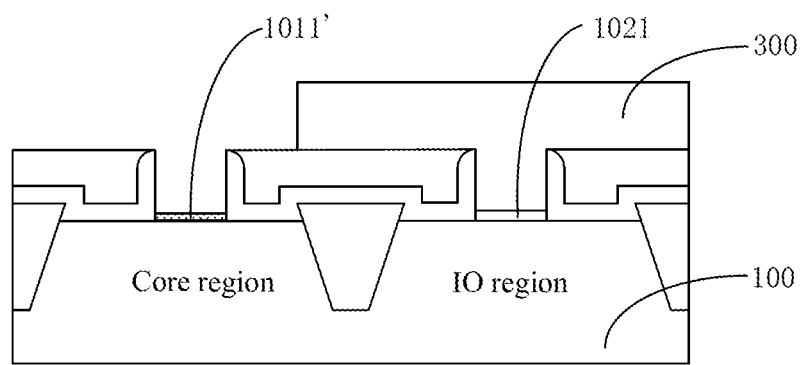
Figure 1D:
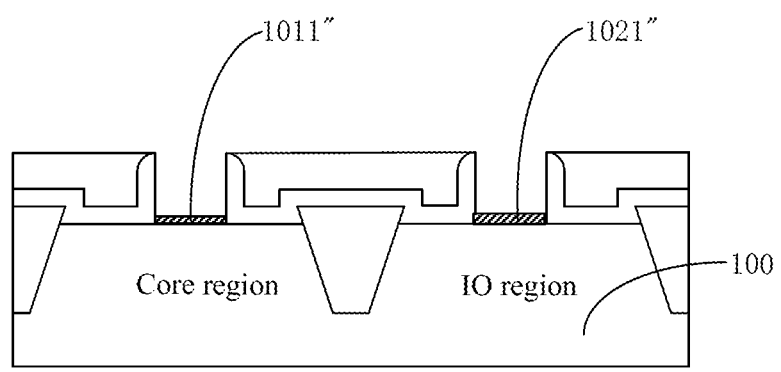
Figure 1E:
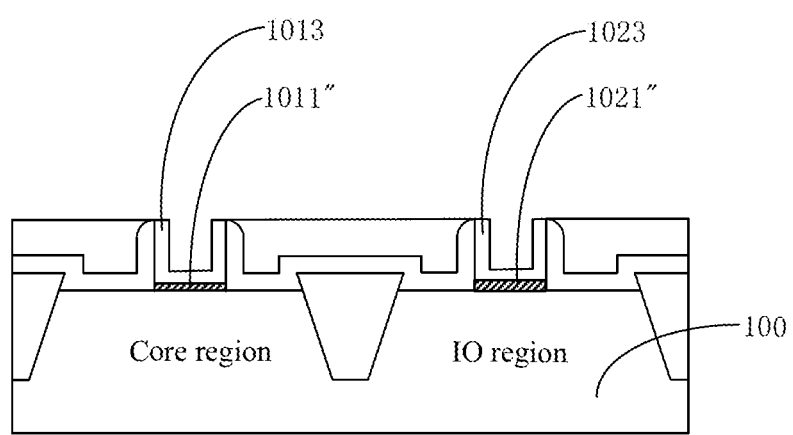
Figure 1F:
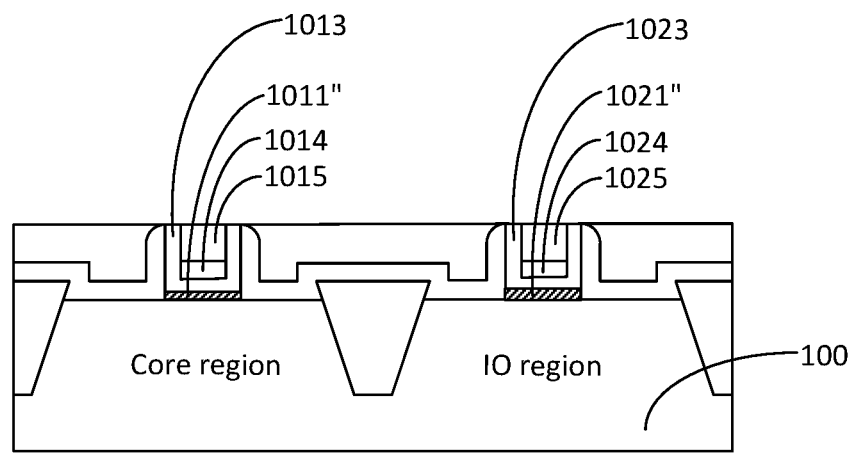
Figure 2:
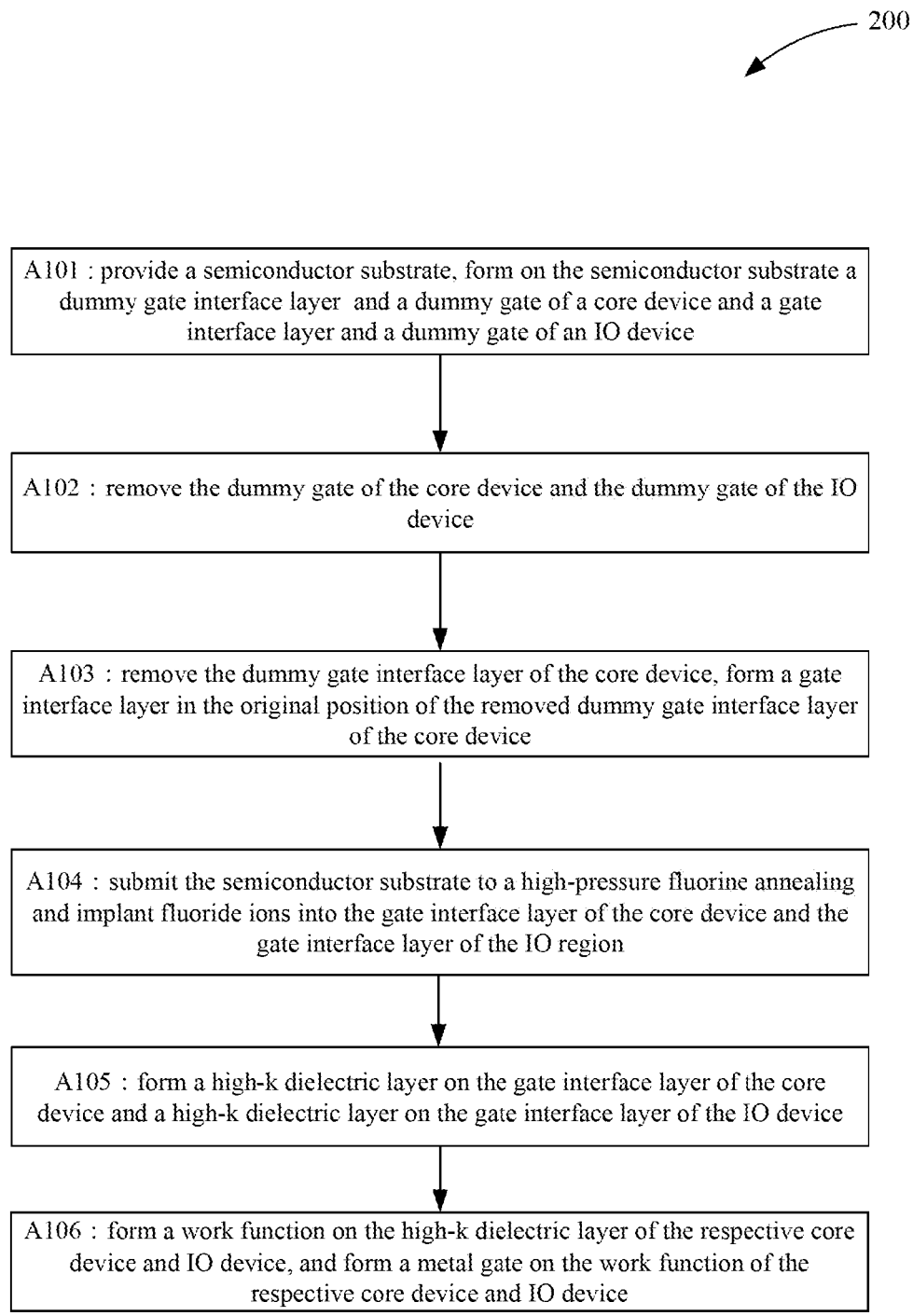
FIG. 2 is a flowchart diagram of a manufacturing method of a semiconductor device according to a first embodiment of the present invention.
Figure 3:
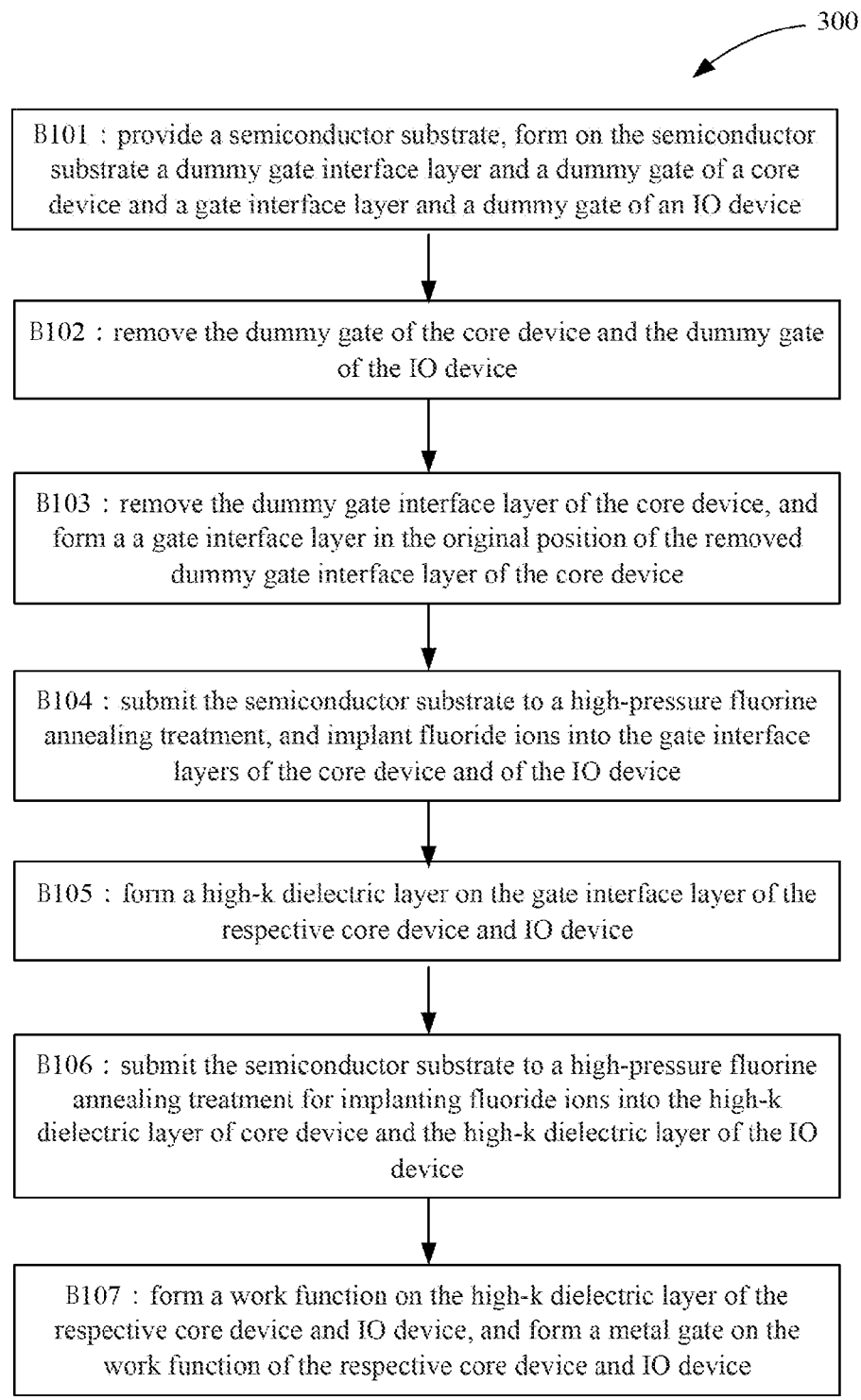
FIG. 3 a flowchart diagram of a manufacturing method of a semiconductor device according to a second embodiment of the present invention.
Figure 4:
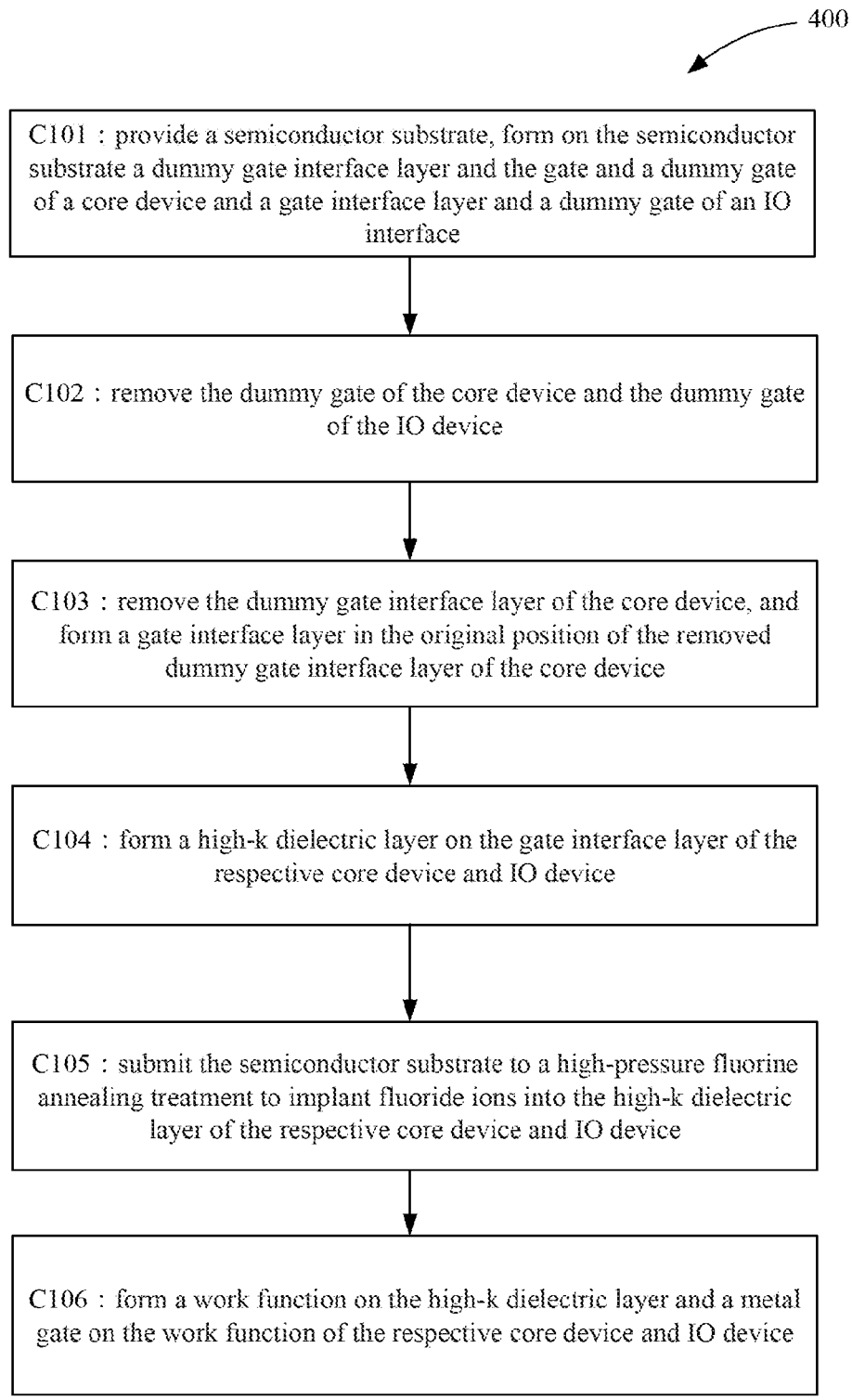
FIG. 4 is a flowchart diagram of a manufacturing method of a semiconductor device according to a third embodiment of the present invention.

Referring to FIGS. 1A to 1F, FIG. 2, FIG. 3, and FIG. 4, embodiments of the present invention will propose a semiconductor device and a method for manufacturing the semiconductor device. FIGS. 1A-1F are cross-sectional views of sequential steps of the method of manufacturing a semiconductor device according to an embodiment of the structure formed of the invention. FIG. 2 is a flowchart diagram of a method for manufacturing a semiconductor device according to an embodiment of flowchart. FIG. 3 is a flowchart diagram of a method of manufacturing a semiconductor device according to another embodiment of the present invention. FIG. 4 is a flow diagram of a method of manufacturing a semiconductor device according to yet another embodiment of the present invention.

In accordance with the present invention, a method for manufacturing a semiconductor device may comprise the following steps:

A1: Providing a semiconductor substrate 100 including a core region and an IO region (i.e., input and output region), forming a dummy gate interface layer 1011 on the semiconductor substrate and a dummy gate 1012 of a core device in the core region and forming a gate interface layer 1021 on the semiconductor substrate and a dummy gate 1022 of an IO device in the IO region. Dummy gate 1012 is formed on the dummy gate dielectric layer 1011, and dummy gate 1022 is formed on gate interface layer 1021, as shown in FIG. 1A.

Dummy gate interface layer 1011 of the core device is generally an oxide layer, which is referred to as core device gate oxide layer 1011. Further, the oxide layer generally is formed by a direct oxidation of the semiconductor substrate 100.

In some embodiments, dummy gate interface layer 1011 can be the same materials as those of gate dielectric layer 1021, and the materials can generally be oxide. Dummy gate interface layer 1011 and gate interface layer 1021 may be formed in the same process. Dummy gates 1012 and 1022 may generally be polysilicon and be formed in the same process.

The method in step A1 may further include the steps of forming an active region and a well region, forming an off set sidewall layer, forming a lightly doped (LDD) region, forming sidewall spacers, forming an interlayer dielectric layer, stress generating approaches, etc. The above steps can be implemented using various conventional processes, and will not be described herein for the sake of brevity.

In step A2, the method includes removing dummy gate 1012 of the core device and dummy gate 1022 of the IO device, as shown in FIG. 1B.

The process of removing the dummy gate 1012 of the core device and dummy gate 1022 of the IO device may include a dry etching following by a wet etching or using only a wet etching process. The removal of dummy gates 1012, 1022 stops at dummy gate interface layer 1011 of the core device and gate interface layer 1021 of the IO device.

After step A2, dummy gate 1012 of the core device and dummy gate 1022 of the IO device are completely removed to expose a surface of dummy gate interface layer 1011 and a surface of gate interface layer 1021.

In step A3, dummy gate interface layer 1011 of the core device is removed, and a gate interface layer (IL) 1011' is formed in the original location of the removed dummy gate interface layer, as shown in FIG. 1C.

The removal of the dummy gate interface layer 1011 of the core device can use a dry etching process or a wet etching process. Forming the gate interface layer (IL) 1011' in the original position of the removed dummy gate interface layer 1011 of the core device can use a chemical oxidation process or a thermal oxidation process. Gate interface layer (IL) 1011' is typically an oxide.

Prior to removing dummy gate interface layer 1011 in the core region, a protective layer 300 is formed in the IO region to protect gate interface layer 1021 in the IO region, as shown in FIG. 1C. Protective layer 300 may be a photoresist or other suitable material. The method in step A3 may also include removing protective layer 300 after the gate interface layer 1011' has been formed in the original location of the removed dummy gate interface layer 1011 in the core region.

In this step A3, dummy gate interface layer 1011 has been replaced with gate interface layer IL 1011' while gate interface layer 1021 in the IO region is retained.

In step A4, semiconductor substrate 100 is subjected to a high-pressure fluorine annealing treatment for implanting fluoride ions into gate interface layer IL 1011' of the core device and gate interface layer 1021 of the IO device. After the implantation of fluoride ions by the high-pressure fluorine annealing process, gate interface layer IL 1011' is transformed into a fluorinated gate interface 1011" and gate interface layer 1021 of the IO device is transformed into a fluorinated gate interface 1021", as shown in FIG. 1D.

The high-pressure fluorine annealing process is performed in a fluorine-containing (typically fluorine or fluorine-containing compounds such as boron trifluoride) gas environment. In embodiments of the present embodiment, the "high pressure" in the "high-pressure fluorine annealing process" is referred to as operating under a pressure of 1 standard atmospheric pressure or greater. The high-pressure fluorine annealing process can concurrently perform the activation of the fluoride ions and the implantation of the fluoride ions.

The high-pressure fluorine annealing process can be carried out at a temperature in the range between 350° C. and 500° C., i.e., less than the temperature of the conventional high-temperature annealing. The annealing time is about 5 minutes or more. Annealing is generally controlled by using a pressure greater than or equal to one (1) standard atmospheric pressure and less than or equal to 25 standard atmospheric pressure.

After step A4, the fluoride ions are implanted into the gate interface layers (the gate interface layers refer to as gate interface layer IL 1011' of the core device and gate interface layer 1021 of the IO device) and the surface region that interfaces between the gate interface layers and the semiconductor substrate surface, so that a strong chemical bond of Hf—F and Si—F is formed at the interface between the gate interface layers and the semiconductor substrate, the chemical bond will improve the stability of the core device and the IO device.

In step A5, a high-k dielectric layer 1013 is formed on gate interface layer 1011" of the core device and a high-k dielectric layer 1023 is formed on gate interface layer 1021" of the IO device, as shown in FIG. 1E.

In some embodiments, high-k dielectric layer 1013 of the core device and high-k dielectric layer 1023 of the IO device may have a U-shaped cross-section, as shown in FIG. 1E. Of course, the cross-section of high-k dielectric layer 1013 of the core device and high-k dielectric layer 1023 of the IO device may have other shapes, such as rectangular shapes. The high-k dielectric layer of the core device having a U-shaped cross-section can improve the work function of the core device and increase good contact between the metal gate and the high-k dielectric layer, enhance the performance of the core device, and improve the overall semiconductor device performance. Likewise, high-k dielectric layer 1023 of the IO device having a U-shaped cross-section also provides similar advantages described above in connection with high-k dielectric layer 1013 of the core device.

The method at step A5 may also include subjecting the semiconductor substrate to a high pressure fluorine annealing process to implant fluoride ions to high-k dielectric layer 1013 of the core device and to high-k dielectric layer 1023 of the IO device.

In some embodiments, the high-pressure fluorine annealing may include a treatment of the core and IO devices at high pressure in the fluorine-containing (typically fluorine or fluorine-containing compounds such as boron trifluoride) gas environment. In embodiments of the present embodiment, the "high pressure" in the "high fluorine annealing process" is referred to as under a pressure of 1 standard atmospheric pressure or greater. The high-pressure fluorine annealing process can concurrently activate the fluoride ions and perform the implantation of fluoride ions.

The annealing temperature annealing process used in the fluorine pressure is generally controlled at a temperature in the range between 350° C. and 500° C., i.e., lower than the temperature of the conventional high-temperature annealing. The annealing time is about 5 minutes or more. The annealing is generally controlled by using a pressure greater than or equal to one (1) standard atmospheric pressure (1 atm) and less than or equal to 25 standard atmospheric pressure (25 atm).

In some embodiments, the high-pressure fluorine annealing process at step A4 is identical to the high-pressure fluorine annealing process at step A5. Because of the high-pressure fluorine annealing process operates at a temperature below the annealing temperature in the conventional art, embodiments of the present invention provide a lower thermal budget and a better control of the implantation dose of fluoride ions in the annealing process, so that the semiconductor substrate will not be damaged by large doses of fluoride ions.

After the high-pressure fluorine annealing process at step A5, the fluorine ions are implanted into the surface of the high-k dielectric layers (the high-k dielectric layer 1013 of the core device and the high-k dielectric layer 1023 of the IO device), which will further increase the reliability of the IO device and improve performance of the final semiconductor device.

The method may include, in step A6, forming work functions 1014, 1024 and metal gates 1015, 1025 in the respective high-k dielectric layer 1013 of the core device and high-k dielectric layer 1023 of the IO device, as shown in FIG. 1F.

In some embodiments, work function 1014 of the core device and work function 1024 of the IO device are not the same for different types of (NMOS or PMOS) devices. They should be set up according to actual applications.

Forming work function layer 1014 and metal gate 1015 of the core device and forming work function layer 1024 and metal gate 1025 of the IO device may employ conventional processes known in the art and will not be described herein.

This completes the introduction of key steps of a semiconductor device manufacturing method according to an embodiment of the present invention. Thereafter, conventional manufacturing processes can further be used to complete the entire semiconductor device in subsequent steps, which will not be described herein. In the present embodiment, the gate interface layer, the high-k dielectric layer, the work function, and the metal gate of the core device and the IO device can be formed using a variety of materials available to conventional processes.

In embodiments of the present invention, step A4 and step A5 in the annealing process using a high-pressure fluorine annealing to implant fluoride ions into high-k dielectric layer 1013 of the core device and into high-k dielectric layer 1023 of the IO device can be performed together or they can be performed separately, i.e., either one or the another and not both (references will be made to flowchart diagrams shown in FIG. 2, FIG. 3, and FIG. 4 described below). In the case where both steps 4 and 5 are performed, because the gate interface layer 1011' and gate interface layer 1021 and high-k gate dielectric layer 1013 as well high-k dielectric layer 1023 are implanted with fluoride ions, the core and IO devices have a better performance. In accordance with embodiments of the present invention, thanks to the use of a high-pressure fluorine annealing process for implanting fluoride ions into gate interface layer 1011' of the core device and gate dielectric layer 1021 of the IO device, reliability of the gate interface layer will be ensured, and performance of the gate interface layer of the semiconductor device will be improved. Furthermore, by using a high-pressure annealing process to implant fluoride ions into high-k dielectric layer 1013 of the core device and into high-k dielectric layer 1013 of the IO device, the methods according to embodiments of the present invention can further improve the performance of the semiconductor device.

FIG. 2 shows a simplified flowchart diagram of a method 200 for manufacturing a semiconductor device according to a first embodiment of the present invention. The method comprises the following steps:

Step A101: provide a semiconductor substrate, form a dummy gate interface layer and a dummy gate of a core device and form a gate interface layer and a dummy gate of an IO device;

Step A102: remove the dummy gate of the core device and the dummy gate of the IO device;

Step A103: remove the dummy gate interface layer of the core device, and form a gate interface layer in the original position of the removed dummy gate interface layer of the core device;

Step A104: subject the semiconductor substrate to a high-pressure fluorine annealing treatment and implant fluoride ions into the gate interface layer of the core device and the gate interface layer of the IO device;

Step A105: form a high-k dielectric layer on the gate interface layer of the core device and a high-k dielectric layer on the gate interface layer of the IO device;

Step A106: form a work function layer on the high-k dielectric layer of the core device and a work function on the high-k dielectric layer of the IO device, and form a metal gate on the work function layer of the core device and a metal gate on the work function of the IO device.

FIG. 3 shows a flowchart diagram of a method 300 for manufacturing a semiconductor device according to a second embodiment of the present invention. The method comprises the following steps:

Step B101: provide a semiconductor substrate, form on the semiconductor substrate a dummy gate interface layer and a dummy gate of a core device and a gate interface layer and a dummy gate of an IO device;

Step B102: remove the dummy gate of the core device and the dummy gate of the IO device;

B103: remove the dummy gate interface layer of the core device, and form a gate interface layer in the original position of the removed dummy gate interface layer of the core device;

Step B104: submit the semiconductor substrate to a first high-pressure fluorine annealing treatment for implanting fluoride ions into the gate interface layers of the core device and of the IO device;

Step B105: form a high-k dielectric layer on the gate interface layer of the respective core device and IO device;

Step B106: submit the semiconductor substrate to a second high-pressure fluorine annealing treatment for implanting fluoride ions into the high-k dielectric layer of core device and the high-k dielectric layer of the IO device;

Step B107: form a work function layer on the high-k dielectric layer of the respective core device and IO device, and form a metal gate on the work function layer of the respective core device and IO device.

FIG. 4 shows a flowchart diagram of a method 400 for manufacturing a semiconductor device according to a third embodiment of the present invention. Method 400 includes the steps of:

Step C101: provide a semiconductor substrate, form on the semiconductor substrate a dummy gate interface layer and the gate and a dummy gate of a core device and a gate interface layer and a dummy gate of an IO device;

Step C102: remove the dummy gate of the core device and the dummy gate of the IO device;

Step C103: remove the dummy gate interface layer of the core device, and form a gate interface layer in the original position of the removed dummy gate interface layer of the core device;

Step C104: form a high-k dielectric layer on the gate interface layer of the respective core device and IO device;

Step C105: submit the semiconductor substrate to a high-pressure fluorine annealing treatment to implant fluoride ions into the high-k dielectric layer of the respective core device and IO device;

Step C106: form a work function layer on the high-k dielectric layer and a metal gate on the work function layer of the respective core device and IO device.

Second Embodiment

Embodiments of the present invention provide a semiconductor device, which may be fabricated using one of the above-described manufacturing methods.

The semiconductor device may include a core device disposed in the core region and an IO device disposed in the IO region, a gate interface layer and/or a high-k dielectric layer doped with fluorine ions. The thus fabricated semiconductor device has a gate dielectric layer (including a gate interface layer and high-k dielectric layer) with better quality and performance with respect to a conventional semiconductor device.

Figure 5:
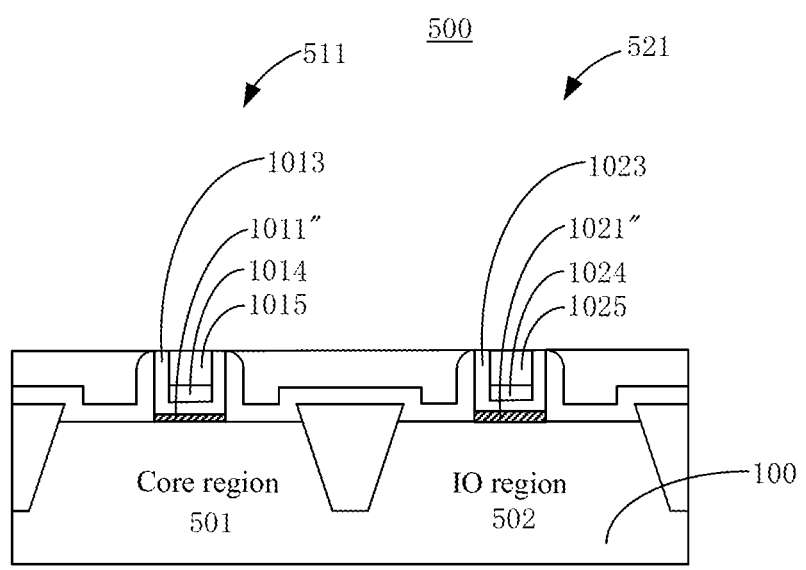
FIG. 5 is a simplified cross-sectional view of a semiconductor device according to certain embodiments of the present invention.

FIG. 5 is a simplified cross-sectional view of a semiconductor device 500 according to the second embodiment of the present invention.

As shown in FIG. 5, semiconductor device 500 includes a semiconductor substrate 100 having a core device 511 disposed in a core region 501 and an IO device 521 disposed in an IO region 502. Core device 511 includes a gate interface layer 1011" on semiconductor substrate 100 and a high-k dielectric layer 1013 on gate interface layer 1011". IO device 521 includes gate interface layer 1021" on semiconductor substrate 100 and a high-k dielectric layer 1023 on gate interface layer 1021". Gate interface layer 1011" of core device 511 and gate interface layer 1021" of IO device 521 are doped with fluoride ions.

In addition, high-k dielectric layer 1013 of core device 511 and high-k dielectric layer 1023 of IO device 521 are doped with fluoride ions.

Furthermore, high-k dielectric layer 1013 of core device 511 and high-k dielectric layer 1023 of IO device 521 have each a U-shaped cross-section, as shown in FIG. 5. Of course, high-k dielectric layers 1013, 1023 of the respective core and IO devices may also have other shapes, such as a rectangular shape. The U-shaped cross-section of high-k dielectric layer 1013 of core device 511 provides the advantages of forming good contact between the work function layer, the metal gate, and the high-k dielectric layer 1013 to improve the performance of the core device and the overall semiconductor device performance. Similarly, the U-shaped cross section of high-k dielectric layer 1023 of IO device 521 also provides similar advantages described above.

Moreover, semiconductor device 500 includes a work function layer 1014 on high-k dielectric layer 1013 and a metal gate 1015 on work function layer 1014 of core device 511. Semiconductor device 500 also includes a work function layer 1024 on high-k dielectric layer 1023 and a metal gate 1025 on work function layer 1024 of IO device 521.

Semiconductor device 500 may further include a source electrode and a drain electrode, a lightly doped region, sidewall spacers, and other conventional known elements, which will not be described herein for brevity reason.

Because the semiconductor device includes gate interface layers of the core and IO devices that are doped with fluoride ions, the semiconductor device has a more reliable gate interface layers and improved performance.

While the present invention has been described with specific embodiments, it is to be understood that the embodiments described above are illustrative and not restrictive. Although the invention has been described with respect to specific embodiments, it will be appreciated that the invention is intended to cover all modifications and equivalents within the scope of the appended claims.

What is claimed is:

1. A semiconductor device comprising: a semiconductor substrate having a core device and an IO device, the core device comprising a gate interface layer and a high-k dielectric layer on the gate interface layer, the IO device comprising a gate interface layer and a high-k dielectric layer on the gate interface layer; a first single work function layer directly disposed on the high-k dielectric layer of the core device; and a second single_work function layer directly disposed on the high-k dielectric layer of the IO device, wherein the gate interface layer of the core device and the gate interface layer of the IO device each are doped with fluoride ions, and wherein the high-k dielectric layer of the core device and the high-k dielectric layer of the IO device each are doped with fluoride ions, and a metal gate on the first single work function layer and on the second single work function layer, wherein the metal gate not doped with fluoride ions.

2. The semiconductor device of claim 1, wherein the high-k dielectric layer of the core device and the high-k dielectric layer of the IO device each have a U-shaped cross-section.

3. The semiconductor device of claim 1, wherein the first single work function layer and the second single work function layer comprise a same material.

* * * * *